(12) United States Patent
Takehiro

(10) Patent No.: US 6,794,240 B2
(45) Date of Patent: Sep. 21, 2004

(54) METHOD OF FABRICATING A SEMICONDUCTOR DEVICE

(75) Inventor: Shinobu Takehiro, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/310,774

(22) Filed: Dec. 6, 2002

(65) Prior Publication Data

US 2003/0129797 A1 Jul. 10, 2003

Related U.S. Application Data

(62) Division of application No. 09/497,862, filed on Feb. 4, 2000, now Pat. No. 6,514,813.

(30) Foreign Application Priority Data

Mar. 10, 1999 (JP) .......................................... 11/052810

(51) Int. Cl.[7] .......................................... H01L 21/8242
(52) U.S. Cl. ........................ 438/240; 438/253; 438/396
(58) Field of Search ................................. 438/250–256, 438/240, 393–399

(56) References Cited

U.S. PATENT DOCUMENTS

| | | |
|---|---|---|
| 5,624,865 A | 4/1997 | Schuegraf et al. |
| 5,763,300 A | 6/1998 | Park et al. |
| 5,939,131 A | 8/1999 | Kim et al. |
| 6,037,235 A | 3/2000 | Narwanker et al. |
| 6,146,959 A | 11/2000 | DeBoer et al. |
| 6,174,822 B1 | 1/2001 | Nagano et al. |
| 6,204,203 B1 | 3/2001 | Narwanker et al. |
| 6,228,737 B1 | 5/2001 | Inoue |
| 6,319,832 B1 * | 11/2001 | Uhlenbrock et al. ........ 438/681 |
| 6,335,240 B1 * | 1/2002 | Kim et al. .................. 438/253 |
| 6,365,486 B1 * | 4/2002 | Agarwal et al. ............ 438/393 |

FOREIGN PATENT DOCUMENTS

| | | |
|---|---|---|
| JP | 61-214553 | 9/1986 |
| JP | 04-199828 | 7/1992 |
| JP | 07-263574 | 10/1995 |
| JP | 09-121035 | 5/1997 |
| JP | 10-022455 | 1/1998 |
| JP | 10-074898 | 3/1998 |
| JP | 11-040776 | 2/1999 |

* cited by examiner

*Primary Examiner*—John F. Niebling
*Assistant Examiner*—Jennifer M. Kennedy
(74) *Attorney, Agent, or Firm*—Volentine Francos, PLLC

(57) ABSTRACT

A method of fabricating a semiconductor device wherein leakage current of a capacitor is reduced is provided. The method comprises steps of forming a lower electrode of the surface of a semiconductor substrate, forming a silicon nitride film over the lower electrode, applying a first heat treatment whereby the silicon nitride film is annealed in an atmosphere containing oxygen, forming a dielectric film containing alkaline earth metals over the silicon nitride film, applying a second heat treatment whereby the electric film is annealed in an atmosphere containing oxygen, and forming an upper electrode on the surface of the dielectric film.

19 Claims, 4 Drawing Sheets

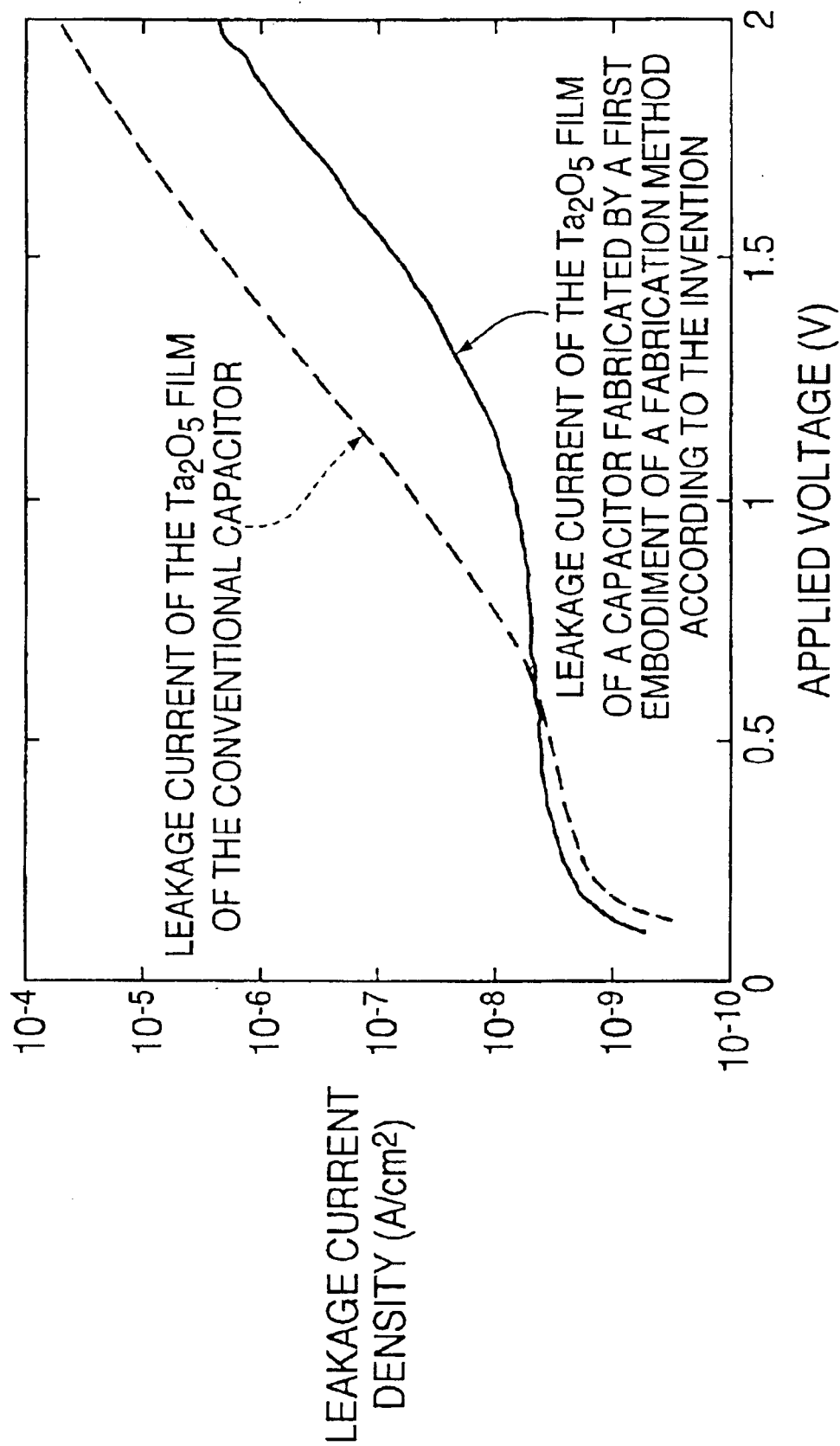

METHOD OF FABRICATING A SEMICONDUCTOR DEVICE

CROSS-REFERENCE TO RELATED APPLICATIONS

This is a divisional of application Ser. No. 09/497,862, filed Feb. 4, 2000, now U.S. Pat. No. 6,514,813 which is incorporated herein by reference in its entirety.

BACKGROUND OF THE INVENTION

1. Field of the Invention

The present invention relates to a method of fabricating a semiconductor device, and more particularly, to a method of forming a capacitor of the semiconductor device.

2. Description of the Related Art

With an advance being made in miniaturization of a semiconductor device, there has since arisen a need for further reducing a capacitor area and so forth. A tantalum oxide film (hereinafter referred to as a $Ta_2O_5$ film) having a high permittivity has recently attracted attention as a dielectric film of a capacitor. The dielectric film needs to be rendered thin for the capacitor to have a sufficient capacitance. However, if the dielectric film is formed too thin, this will cause occurrence of leakage current therefrom. Deficiency of oxygen within the $Ta_2O_5$ film, residual impurity carbon therein, reduction of the $Ta_2O_5$ film due to oxygen being drawn into an electrode material, and so forth are regarded as causes for occurrence of leakage current from the $Ta_2O_5$ film. The technique for performing oxygen annealing after formation of the $Ta_2O_5$ film as a method of making up for deficiency of oxygen therein has been disclosed in Japanese Patent Laid-Open H 9-121035, and Japanese Patent Laid-Open H 4-199828. And a method of preventing oxygen from being drawn into an electrode material by forming the electrode material of a metal having a free energy greater than that for the $Ta_2O_5$ film has been disclosed in Japanese Patent Publication H 6-82782.

However, with the technique for performing the oxygen annealing after formation of the $Ta_2O_5$ film as disclosed in the technical literature described above, difficulty has been encountered in supplying oxygen as far as the vicinity of the interface between the $Ta_2O_5$ film and an underlayer thereof. Further, in the case of changing the electrode material, there have been cases wherein the $Ta_2O_5$ film were subjected to a damage caused by a fluorine-containing gas when forming an electrode over the $Ta_2O_5$ film.

SUMMARY OF THE INVENTION

In order to solve the problems described above, a typical method of fabricating a semiconductor device according to the invention comprises steps of forming a lower electrode on the surface of a semiconductor substrate, forming a silicon nitride film over the lower electrode, applying a first heat treatment whereby the silicon nitride film is annealed in an atmosphere containing oxygen, forming a dielectric film containing alkaline earth metals over the silicon nitride film, applying a second heat treatment whereby the dielectric film is annealed in an atmosphere containing oxygen, and forming an upper electrode on the surface of the dielectric film.

BRIEF DESCRIPTION OF THE DRAWINGS

FIG. 5 is a view showing leakage current from a capacitor fabricated by one of the embodiments of the method of fabrication according to the invention.

PREFERRED EMBODIMENTS OF THE INVENTION

First Embodiment

Figure 1A:
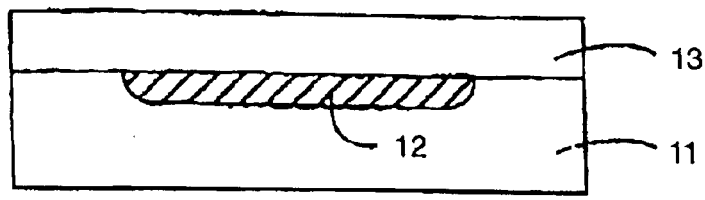
FIG. 1 is a view showing steps of a first embodiment of a method of fabricating a semiconductor device according to the invention.
Figure 1B:
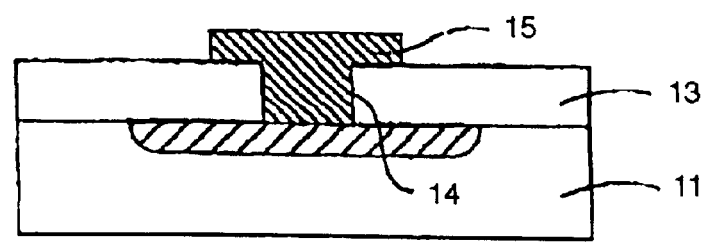
Figure 1C:
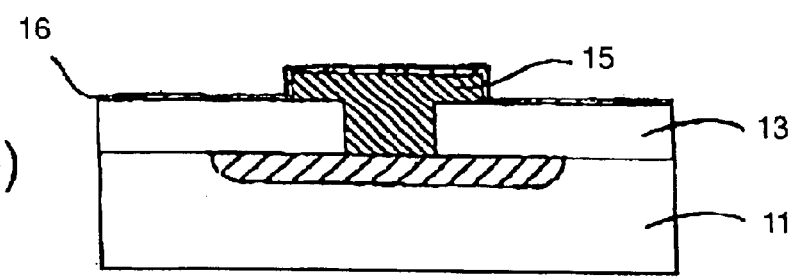
Figure 1D:
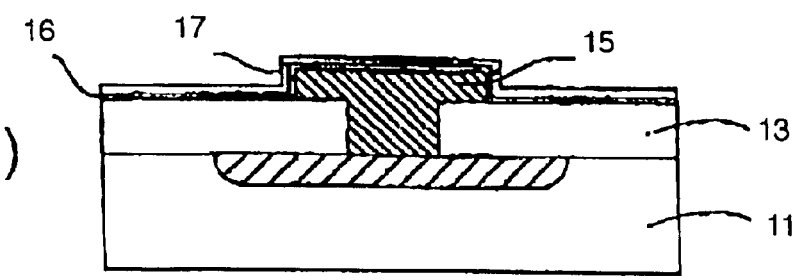
Figure 1E:
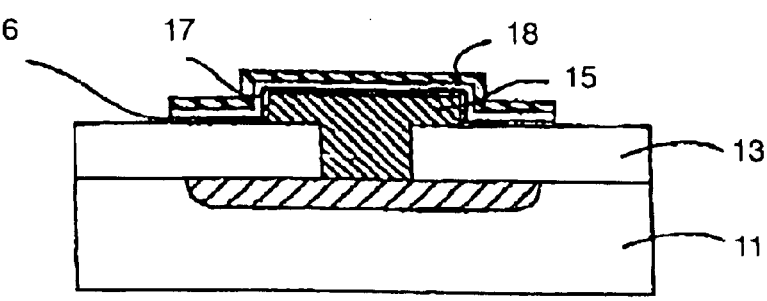
Figure 2A:
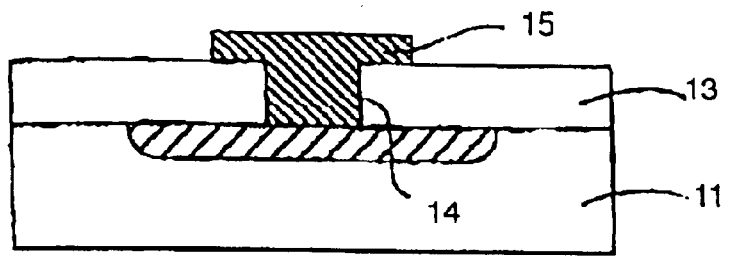
FIG. 2 is a view showing steps of a second embodiment of a method of fabricating a semiconductor device according to the invention.
Figure 2B:
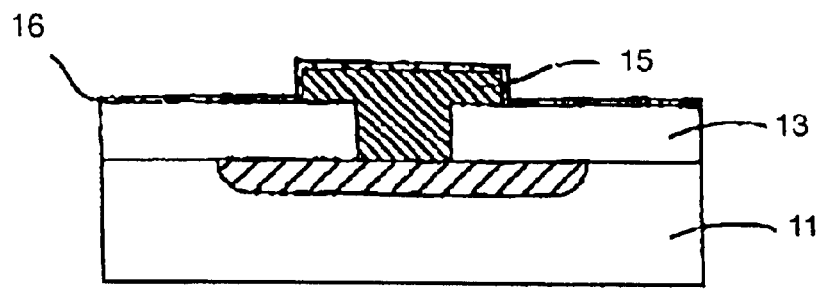
Figure 2C:
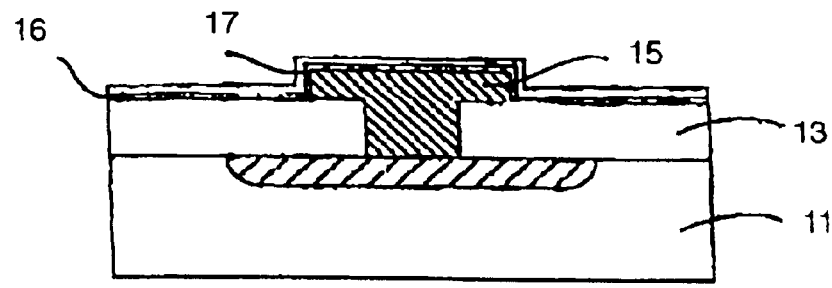
Figure 2D:
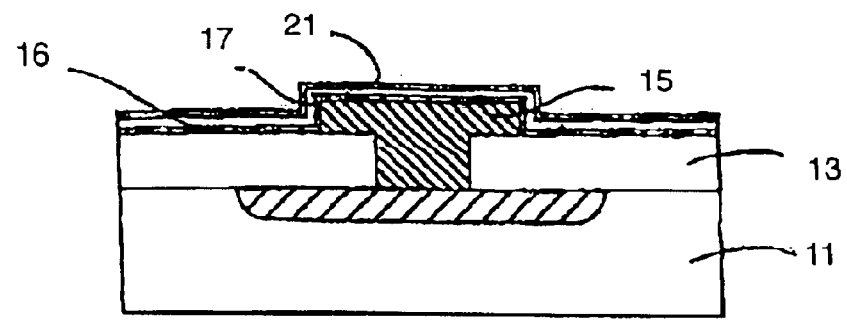
Figure 2E:
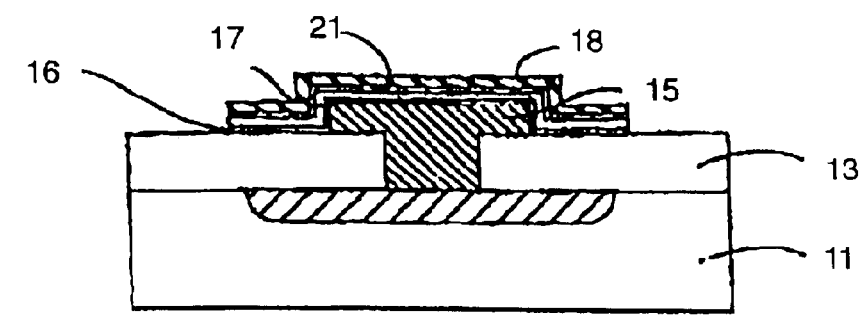

FIG. 1 is a view showing steps of a first embodiment of a method of fabricating a capacitor region of a DRAM and the like according to the invention. The first embodiment of the invention will be described hereinafter with reference to FIG. 1.

By implanting ions into a p-type silicon substrate 11, a n-type diffused region 12 is formed therein. Subsequently, by use of chemical vapor deposition (CVD) techniques, an oxide film 13 serving as an interlayer dielectric is formed over the substrate to a thickness in the range of 100 to 1000 nm (FIG. 1-a).

By use of the photolithographic process and dry etching, a contact hole is formed in the oxide film 13 on top of the n-type diffused region 12. By use of the CVD method, polysilicon 14 doped with phosphorus atoms is embedded in the contact hole.

Then, a polysilicon layer highly doped at a dose on the order of $1\sim10\times10^{20}$ of phosphorus atoms/cm$^3$ is formed throughout the surface of the oxide film 13, and the polysilicon layer is patterned in a predetermined shape by the well known photolithographic etching techniques, forming a lower electrode 15 of a capacitor (FIG. 1-b).

In the case wherein the lower electrode 15 is formed of polysilicon, embedding of the contact hole and formation of a lower electrode layer can be carried out by the one and same step of processing.

By use of the CVD method, a silicon nitride film ($Si_3N_4$ film) 16 is formed over the lower electrode 15 of the capacitor to a thickness of 2 nm (FIG. 1-c).

In a stage where the silicon nitride film 16 has been formed, a first annealing is performed in an oxygen atmosphere. The annealing is preferably performed at a temperature in the range of 500 to 1000° C. by a rapid heating method. In carrying out this embodiment, the first annealing was performed in the temperature range of 800 to 900° C.

As a result of the first annealing in the oxygen atmosphere, silicon atoms still unbonded within the $Si_3N_4$ film will be bonded with oxygen atoms. Since the first annealing is performed prior to formation of a $Ta_2O_5$ film, it is possible to solve a problem that oxygen will not be supplied up to the vicinity of the interface between a $Ta_2O_5$ film and an underlayer thereof.

The $Si_3N_4$ film 16 is formed over the lower electrode 15 of the capacitor. Even if the first annealing is performed in the oxygen atmosphere, the $Si_3N_4$ film 16 prevent a $SiO_2$ film having a very low permittivity from being formed on the surface of the lower electrode 15 of the capacitor.

By use of the CVD method, a $Ta_2O_5$ film 17 is formed over the $Si_3N_4$ film 16 to a thickness of 13 nm. After formation of the $Ta_2O_5$ film 17, a second annealing is performed in an oxygen atmosphere. The second annealing is performed by a rapid heating method at a temperature lower than the temperature for the first annealing. In carrying out this embodiment, the second annealing was performed at a temperature in the order of 600 to 700° C., lower by 200° C. than for the first annealing (FIG. 1-*d*).

The second annealing is performed at a temperature lower than that for the first annealing. This prevents oxygen atoms from being drawn from the $Ta_2O_5$ film 17 into the $Si_3N_4$ film 16. The second annealing may be performed in an ordinary heating furnace, however, annealing by the rapid heating method is preferable from the viewpoint of preventing oxygen atoms from being drawn from the $Ta_2O_5$ film 17 into the $Si_3N_4$ film 16.

Subsequently, by use of the CVD method, a TiN film is formed to a thickness of 30 to 100 nm, and by the photolithographic etching techniques, an upper electrode 18 of the capacitor is formed, thereby completing the capacitor (FIG. 1-*e*).

By use of this embodiment of the method of fabricating a capacitor according to the invention, an excellent capacitor with less leakage current can be fabricated. FIG. 5 shows leakage current of the capacitor fabricated by this embodiment of the method of fabrication according to the invention as compared with that of a capacitor fabricated by the conventional method of fabrication.

As shown in FIG. 5, the capacitor fabricated by the method of fabrication according to the invention has leakage current less than that of the capacitor fabricated by the conventional method of fabrication.

With this embodiment of the invention, the $Si_3N_4$ film 16 formed over the lower electrode 15 prevents oxidation of the lower electrode 15. However, since the $Si_3N_4$ film 16 has a lower permittivity in comparison with the $Ta_2O_5$ film 17, it is desirable that the $Si_3N_4$ film 16 is formed to a sufficiently thin thickness in comparison with a thickness of the $Ta_2O_5$ film 17 in order to secure a large capacitance of the capacitor.

Second Embodiment

FIG. 2 is a view showing steps of a second embodiment of a method of fabricating a capacitor region of a DRAM and the like according to the invention. Parts corresponding to those previously described with reference to FIG. 1 are denoted by the same reference numerals. The second embodiment of the invention will be described hereinafter with reference to FIG. 2.

The method of fabrication according to the second embodiment is the same as that according to the first embodiment up to the steps of performing a second annealing after forming a $Ta_2O_5$ film 17 over a lower electrode 15 of a capacitor and a silicon nitride film 16 (FIG. 2-*c*).

Subsequently, by use of the CVD method, a TiN film is formed over the $Ta_2O_5$ film 17 to a thickness of 1 to 10 nm after the step of performing the second annealing, and thereafter, a third annealing is performed in an oxygen atmosphere. The third annealing is performed by the rapid heating method at a temperature lower than that for the first annealing described above.

As a result of the third annealing, an oxide film 21 of TiN for constituting an upper electrode is formed over the $Ta_2O_5$ film 17 (FIG. 2-*d*).

By use of the CVD method, a TiN film is formed over the oxide film 21 of TiN to a thickens of 10 to 20 nm so as to serve as an upper electrode 18 of the capacitor, thus completing fabrication of the capacitor (FIG. 2-*e*).

With this embodiment of the invention, the oxide film 21 of TiN for composing the upper electrode is interposed between the $Ta_2O_5$ film 17 and the TiN film serving as the upper electrode 18. Hence, it is possible to prevent oxygen from being drawn from within the $Ta_2O_5$ film 17 into the TiN film 18. Consequently, with this embodiment, leakage current can be further reduced than in the case of the first embodiment.

Third Embodiment

Figure 3:
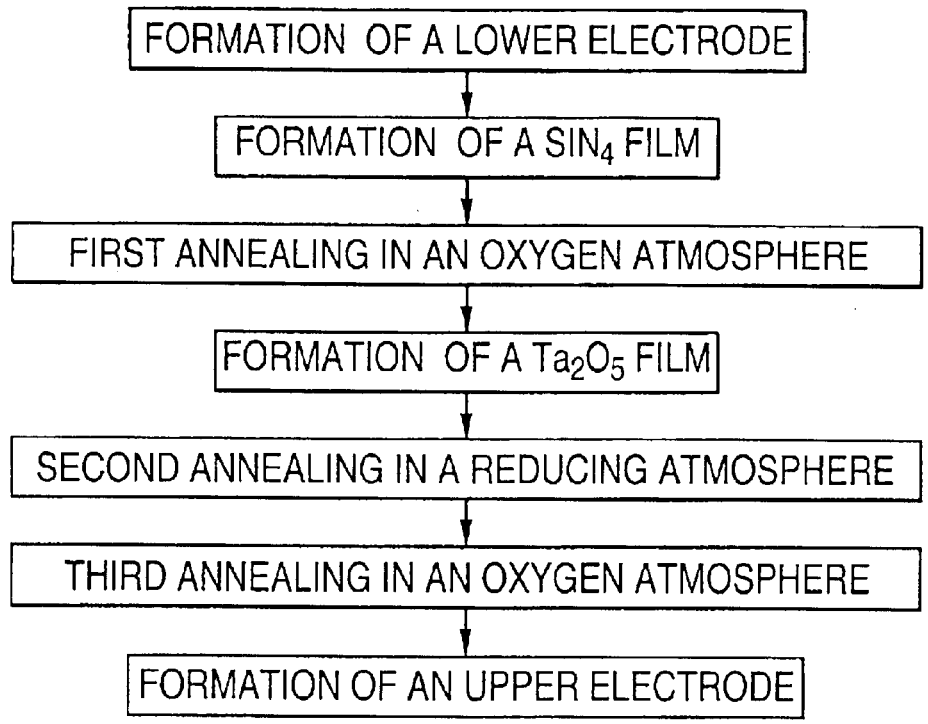
FIG. 3 is a flow sheet showing steps of a third embodiment of a method of fabricating a semiconductor device according to the invention.

FIG. 3 is a flow sheet showing steps of a third embodiment of a method of fabricating a capacitor region of a DRAM and the like according to the invention. The third embodiment of the invention will be described hereinafter with reference to FIG. 3.

The method of fabrication according to the third embodiment is the same as that according to the first embodiment up to the steps of forming a $Ta_2O_5$ film over a lower electrode of a capacitor.

With this embodiment, a second annealing is performed at a temperature in the range of 400 to 600° C. in a reducing atmosphere (containing hydrogen $H_2$, ammonia $NH_3$, and so forth) after the $Ta_2O_5$ film is formed.

As a hydrogen atom has a atomic radius smaller than that of an oxygen atom, the hydrogen atom is susceptible to diffusion within the $Ta_2O_5$ film. The hydrogen atoms diffused in the $Ta_2O_5$ film are bonded with residual carbon contained in the $Ta_2O_5$ film. The residual carbon combined with the hydrogen atoms makes up a volatile matter such as $CH_4$ etc. and undergoes volatilization. As a result of the second annealing described, the residual carbon in the $Ta_2O_5$ film can be effectively removed.

Subsequently, a third annealing is performed in an oxygen atmosphere. The third annealing is performed by the rapid heating method at a temperature lower by 200° C. than that for a first annealing previously performed.

Thereafter, by use of the CVD method, an upper electrode of the capacitor is formed so as to serve as the upper electrode of the capacitor, thus completing fabrication of the capacitor.

With this embodiment of the invention, the second annealing is applied to the $Ta_2O_5$ film in the reducing atmosphere (containing hydrogen $H_2$, ammonia $NH_3$, and so forth), thereby reducing the residual carbon. Hence, it is possible to further reduce leakage current than in the case of the first embodiment of the invention.

Fourth Embodiment

Figure 4:
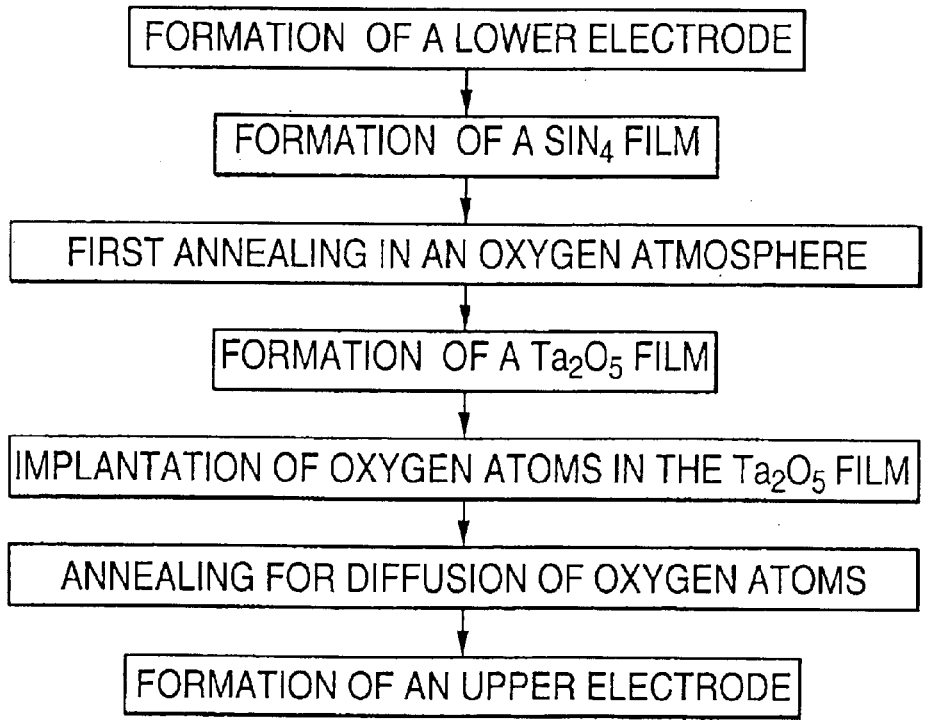
FIG. 4 is a flow sheet showing steps of a fourth embodiment of a method of fabricating a semiconductor device according to the invention.

FIG. 4 is a flow sheet showing steps of a fourth embodiment of a method of fabricating a capacitor region of a DRAM and the like according to the invention. The fourth embodiment of the invention will be described hereinafter with reference to FIG. 4.

The method of fabrication according to the fourth embodiment is the same as that according to the first embodiment up to the steps of forming a $Ta_2O_5$ film over a lower electrode of a capacitor.

With this embodiment of the invention, during a period subsequent to formation of the $Ta_2O_5$ film, oxygen atoms are implanted into the $Ta_2O_5$ film by means of ion implantation at implantation energies ranging from 10 KeV to 1 MeV. After the oxygen atoms are implanted therein, an annealing treatment is applied at a temperature in the range of 500 to 1000° C. in order to cause the oxygen atoms to be diffused.

Thereafter, by use of the CVD method or the equivalent, an upper electrode of the capacitor is formed so as to serve as the upper electrode of the capacitor, thus completing fabrication of the capacitor.

With this embodiment of the invention, oxygen atoms are supplied to the $Ta_2O_5$ film by the ion implantation method instead of by the annealing in an oxygen atmosphere. Hence, the oxygen atoms can be supplied thereto more effectively and with better control than in the case of the annealing in an oxygen atmosphere.

Fifth Embodiment

Next, a fifth embodiment of a method of fabricating a capacitor according to the invention will be described. With the fifth embodiment of the invention, steps of a method of fabricating the capacitor are the same as those described with reference to the first embodiment.

In this embodiment, a lower electrode 15 formed at first is not made of polysilicon, but made of TiN, the same kind of material that an upper electrode to be formed later is made of.

That is, after the polysilicon 14 is embedded as shown in FIG. 1, the lower electrode 15 is formed by use of the CVD method or the equivalent.

A difference in work function between the lower electrode and an upper electrode of a capacitor due to a difference in material used is one of causes for occurrence of leakage current.

Accordingly, with this embodiment of the invention, both the lower electrode and the upper electrode are made of the same material, thereby enabling further reduction in the leakage current to be achieved.

Further, with reference to various embodiments described in the foregoing, use of the $Ta_2O_5$ film as a dielectric film has been described, however, similar effects can be obtained by use of a dielectric film other than the $Ta_2O_5$ film, containing alkaline earth metals such as $(Ba,Sr)TiO_3$, $Pb(Zr,Ti)O_3$, and so forth.

What is claimed is:

1. A method of fabricating a semiconductor device, comprising:
    forming a lower electrode on a surface of a semiconductor substrate;
    forming a silicon nitride film on the lower electrode;
    annealing the silicon nitride film at a first temperature in an atmosphere containing oxygen to form an oxygen containing silicon nitride film;
    forming a dielectric film over the oxygen containing silicon nitride film;
    annealing the dielectric film at a second temperature, which is lower than the first temperature, in an atmosphere containing oxygen so as to prevent oxygen atoms from being drawn from the dielectric film into the oxygen containing silicon nitride film; and
    forming an upper electrode on a surface of the annealed dielectric film.

2. The method according to claim 1, wherein said annealing of the dielectric film is performed at a temperature range of 600 to 700° C.

3. The method according to claim 2, wherein said annealing of the dielectric film is performed by a rapid heating method.

4. The method according to claim 2, wherein unbonded silicon atoms of the silicon nitride film are bonded with oxygen atoms by said annealing of the silicon nitride film.

5. The method according to claim 1, wherein the silicon nitride film is formed to be thinner than the dielectric film.

6. A method of fabricating a semiconductor device, comprising:
    forming a silicon nitride film over a surface of a semiconductor substrate;
    annealing the silicon nitride film at a first temperature in an atmosphere containing oxygen to obtain an oxygen containing silicon nitride film;
    forming a dielectric film over the oxygen containing silicon nitride film;
    annealing the dielectric film at a second temperature, which is lower than the first temperature, in an atmosphere containing oxygen so as to prevent oxygen atoms from being drawn from the dielectric film into the oxygen containing silicon nitride film; and
    forming a conductive film over the annealed dielectric film.

7. The method according to claim 6, wherein said annealing of the silicon nitride film is performed at a temperature range of 800° C. to 900° C.

8. The method according to claim 7, wherein said annealing of the silicon nitride film is performed by a rapid heating method.

9. The method according to claim 6, wherein said dielectric film includes tantalum pentoxide.

10. The method according to claim 6, wherein said annealing of the silicon nitride film is performed at a temperature range of 800° C. to 900° C.

11. The method according to claim 10, wherein said annealing of the silicon nitride film is performed by a rapid heating method.

12. The method according to claim 6, wherein said annealing of the dielectric film is performed at a temperature range of 600° C. to 700° C.

13. The method according to claim 12, wherein said annealing of the dielectric film is performed by a rapid heating method.

14. The method according to claim 12, wherein unbonded silicon atoms in the silicon nitride film are bonded with oxygen atoms by said annealing of the silicon nitride film.

15. A method of manufacturing a semiconductor device comprising:
    providing a semiconductor substrate having a major surface thereon;
    forming a lower electrode on a part of the major surface of the substrate;
    forming a silicon nitride on the major surface of the substrate and the lower electrode;
    annealing the silicon nitride film at a first temperature in an atmosphere containing oxygen to form an oxygen nitride silicon film;
    forming a tantalum oxide film at a second temperature that is lower than the first temperature so that oxygen atoms are not drawn from the tantalum oxide film into the oxygen nitride silicon film; and
    forming an upper electrode on the annealed tantalum oxide film.

16. A method of manufacturing a semiconductor device according to claim 15, wherein the silicon nitride film is formed by a chemical vapor deposition method.

17. A method of manufacturing a semiconductor device according to claim 15, wherein the annealing the silicon nitride film is performed by a rapid heating method.

18. A method of manufacturing a semiconductor device according to claim 15, wherein the upper electrode is formed of titanium nitride.

19. A method of manufacturing a semiconductor device according to claim 18, wherein the forming the upper electrode includes:
    forming a first titanium nitride layer on the annealed tantalum oxide film;
    annealing the first titanium nitride film at a third temperature that is lower than the first temperature to form an oxidized titanium nitride film; and
    forming a second titanium nitride film on the oxidized titanium nitride film.

* * * * *